(12) United States Patent
Greene et al.

(10) Patent No.: US 10,923,401 B2
(45) Date of Patent: Feb. 16, 2021

(54) GATE CUT CRITICAL DIMENSION SHRINK AND ACTIVE GATE DEFECT HEALING USING SELECTIVE DEPOSITION

(71) Applicant: International Business Machines Corporation, Armonk, NY (US)

(72) Inventors: Andrew Greene, Albany, NY (US); Marc Bergendahl, Rensselaer, NY (US); Ekmini A. De Silva, Slingerlands, NY (US); Alex Joseph Varghese, Ballston Lake, NY (US); Yann Mignot, Slingerlands, NY (US); Matthew T. Shoudy, Guilderland, NY (US); Gangadhara Raja Muthinti, Albany, NY (US); Dallas Lea, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/172,205

(22) Filed: Oct. 26, 2018

(65) Prior Publication Data
US 2020/0135575 A1    Apr. 30, 2020

(51) Int. Cl.
*H01L 21/8234* (2006.01)
*H01L 21/3205* (2006.01)
(Continued)

(52) U.S. Cl.
CPC ........... *H01L 21/823456* (2013.01); *H01L 21/823431* (2013.01); *H01L 21/823481* (2013.01);
(Continued)

(58) Field of Classification Search
CPC combination set(s) only.
See application file for complete search history.

(56) References Cited

U.S. PATENT DOCUMENTS

| 8,809,194 B2 | 8/2014 | Ranjan et al. |
| 9,818,836 B1 | 11/2017 | Sung et al. |

(Continued)

FOREIGN PATENT DOCUMENTS

| CN | 107658308 A | 2/2018 |
| CN | 107658308 A1 | 2/2018 |
| KR | 20050064202 A | 6/2005 |

OTHER PUBLICATIONS

Authors et. al., Disclosed Anonymously, "Gate Cut after Replacement Metal Gate with Air Gap Formation", IP.com Electronic Publication Date: Nov. 14, 2016, 6 pps.
(Continued)

*Primary Examiner* — Ratisha Mehta
(74) *Attorney, Agent, or Firm* — Cantor Colburn LLP; Douglas Pearson

(57) ABSTRACT

Embodiments of the present invention are directed to techniques for providing a gate cut critical dimension (CD) shrink and active gate defect healing using selective deposition. The selective silicon on silicon deposition described herein effectively shrinks the gate cut CD to below lithographic limits and repairs any neighboring active gate damage resulting from a processing window misalignment by refilling the inadvertently removed sacrificial material. In a non-limiting embodiment of the invention, a sacrificial gate is formed over a shallow trench isolation region. A portion of the sacrificial gate is removed to expose a surface of the shallow trench isolation region. A semiconductor material is selectively deposited on exposed sidewalls of the sacrificial gate. A gate cut dielectric is formed on a portion of the shallow trench isolation between sidewalls of the semiconductor material.

20 Claims, 12 Drawing Sheets

(51) Int. Cl.
   H01L 29/66      (2006.01)
   H01L 21/3213    (2006.01)
(52) U.S. Cl.
   CPC .. H01L 21/32055 (2013.01); H01L 21/32139
                (2013.01); H01L 29/66545 (2013.01)

(56) References Cited

U.S. PATENT DOCUMENTS

| | | |
|---|---|---|
| 9,960,077 B1 | 5/2018 | Zang et al. |
| 2014/0197499 A1 | 7/2014 | Chen et al. |
| 2015/0340491 A1 | 11/2015 | Zang et al. |
| 2016/0013313 A1 | 1/2016 | Cheng et al. |
| 2016/0233094 A1 | 8/2016 | Anderson et al. |
| 2017/0148682 A1 | 5/2017 | Basker et al. |
| 2017/0342553 A1 | 11/2017 | Yu et al. |
| 2018/0069000 A1 | 3/2018 | Bergendahl et al. |
| 2018/0097107 A1 | 4/2018 | Anderson et al. |
| 2018/0315752 A1 | 11/2018 | Fan et al. |
| 2019/0229183 A1* | 7/2019 | Wang ................ H01L 21/76224 |

OTHER PUBLICATIONS

Authors et. al., Disclosed Anonymously, "Self-Aligned Gate Isolation Process for FINFET CMOS beyond 10nm", IP.com Electronic Publication Date: Mar. 31, 2016, 7 pps.

* cited by examiner

GATE CUT CRITICAL DIMENSION SHRINK AND ACTIVE GATE DEFECT HEALING USING SELECTIVE DEPOSITION

BACKGROUND

The present invention generally relates to fabrication methods and resulting structures for semiconductor devices, and more specifically, to fabrication methods and resulting structures for providing a gate cut critical dimension (CD) shrink and active gate defect healing using selective deposition.

In conventional field effect transistor (FET) processing, a gate is formed adjacent to at least one channel region within at least one semiconductor body. In the case of a planar FET, the semiconductor body can include a planar semiconductor body defined by a trench isolation region, and the gate can be positioned on a top surface of that planar semiconductor body. Alternatively, in the case of a non-planar FET, such as a fin-type FET (finFET) or nanosheet FET, the semiconductor body can include a non-planar semiconductor body. In a nanosheet FET, for example, the gate stack wraps around the full perimeter of each nanosheet, enabling fuller depletion in the channel region, and reducing short-channel effects due to steeper subthreshold swing (SS) and smaller drain induced barrier lowering (DIBL).

In either case, one goal for designing new integrated circuits (ICs) is to increase device density. Conventional methods of forming FETs, however, limit the ability to increase device density due to minimum requirements for gate-to-gate spacing as well as semiconductor body-to-semiconductor body spacing. Specifically, during conventional FET processing, adjacent gates (e.g., gates in an end-to-end alignment) are typically spaced some fixed minimum distance apart. This minimum distance is defined as that required to avoid processing-induced defects, such as shorting between the gates, and directly limits increases in device density. Similarly, adjacent semiconductor bodies (e.g., semiconductor bodies, such as semiconductor fins, in an end-to-end alignment) must be spaced some fixed minimum distance apart to avoid shorting, further limiting increases in device density.

SUMMARY

Embodiments of the invention are directed to a method for providing a gate cut critical dimension (CD) shrink and active gate defect healing using selective deposition. A non-limiting example of the method includes forming a sacrificial gate over a shallow trench isolation region. A portion of the sacrificial gate is removed to expose a surface of the shallow trench isolation region. A semiconductor material is selectively deposited on exposed sidewalls of the sacrificial gate. A gate cut dielectric is formed on a portion of the shallow trench isolation region between sidewalls of the semiconductor material.

Embodiments of the invention are directed to a method for providing a gate cut critical dimension (CD) shrink and active gate defect healing using selective deposition. A non-limiting example of the method includes forming a first sacrificial gate in a gate cut region of a shallow trench isolation region. A second sacrificial gate is formed in an active gate region of the shallow trench isolation region. A portion of the first sacrificial gate and a portion of the second sacrificial gate are removed to expose a surface of the shallow trench isolation region. A semiconductor material is selectively deposited on an exposed sidewall of the first sacrificial gate and on an exposed sidewall of the second sacrificial gate. In certain embodiments, the semiconductor material on the exposed sidewall of the second sacrificial gate completely covers the shallow trench isolation region. A gate cut dielectric is formed on a portion of the shallow trench isolation region between sidewalls of the semiconductor material on the first sacrificial gate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
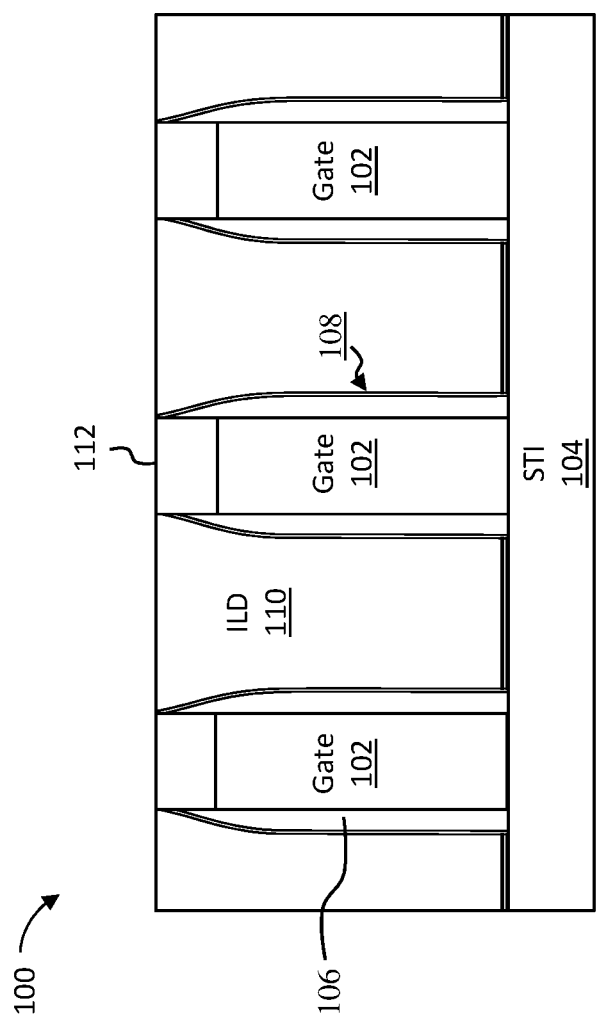
FIG. 1 depicts a cross-sectional view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, one goal for designing new ICs is to increase device density. Device density can be increased in various ways, for example, by decreasing gate-to-gate spacing. Gate-to-gate spacing refers to the end-to-end separation between adjacent gates. The gate-to-gate spacing for a particular pair of adjacent gates is determined during a gate cut process, during which a portion of sacrificial gate material is removed to define the two adjacent gates. In a conventional process, the critical dimension (e.g., end-to-end width) of the removed portion of sacrificial gate material is the gate-to-gate spacing. Accordingly, there is significant interest in improving (i.e., decreasing) the gate cut critical dimension (CD).

There are challenges, however, associated with reducing the minimum gate-to-gate spacing or gate cut CD when scaling some transistor architectures beyond the 10 nm node. One such challenge is to prevent an overlay error during processing when the gate-to-gate spacing (gate cut CD) approaches the limits of conventional optical or EUV patterning. As gate pitch continues to scale, there is less room for overlay errors, and inadvertent etching of neighboring gates becomes more prevalent. The liner edge roughness (LER) must also be considered. In addition, the main issue with an overlap of a neighboring gate is "CD blow up" during the antireflective coating (ARC)/organic planarization layer (OPL) RIE which increases the CD that can overlap the neighbor gate. Accordingly, at or below the limits of photolithography, overlay errors become increasingly common, and difficult, if not impossible, to circumvent. Overlay errors can result in the gate cut processing window partially overlapping a neighboring active gate. This scenario can result in a gate open and a dead device. Conversely, overlay errors can result in the gate cut processing window to fail to completely cover the cut gate. This scenario can result in an incomplete gate etch and a gate-to-gate short.

Turning now to an overview of aspects of the present invention, one or more embodiments of the invention address the above-described shortcomings of the prior art by providing fabrication methods and resulting structures for providing a gate cut CD shrink and gate defect healing using selective deposition. The gate cut process described herein can scale the final gate cut CD to below the dimensions that optical or EUV lithography can print and relaxes the gate cut CD requirements during lithography. The gate cut process begins conventionally with the deposition of a gate cut patterning stack over one or more sacrificial gates (sometimes referred to as dummy gates). The sacrificial material of the gates to be cut is then removed within the gate cut processing window. As described previously herein, overlap errors and patterning blow-up during RIE can result in the gate cut processing window partially overlapping a neighboring active gate. As a result, the neighboring gate can be partially etched (i.e., the sacrificial material of the neighboring gate can be inadvertently removed).

A selective silicon on silicon deposition process is then leveraged to regrow portions of the removed sacrificial gate material. During this process, silicon grows on exposed silicon surfaces, but does not grow on exposed dielectric regions, such as portions of the shallow trench isolation (STI) or gate spacers. The selective silicon on silicon deposition provides two primary benefits. First, the selective silicon on silicon deposition effectively shrinks the gate cut CD to below the lithography limit, as silicon grows from the exposed sidewalls of the cut gates. In this manner, the final gate cut CD can be less than about 15 nm (i.e., below even EUV lithography and patterning limits). Second, the selective silicon on silicon deposition repairs any neighboring gate damage resulting from the processing window misalignment by refilling the inadvertently removed sacrificial material. In addition, the gate cut process described herein results in a gate cut CD shrink post-ME (i.e., not during patterning), ensuring that the silicon etch can be completed without increasing the likelihood of residual silicon remaining after the etch.

Turning now to a more detailed description of aspects of the present invention, FIG. 1 depicts a cross-sectional view of a semiconductor structure 100 during an intermediate operation of a method of fabricating a semiconductor device according to one or more embodiments of the invention. As depicted in FIG. 1, a partially fabricated semiconductor device can include one or more sacrificial gates 102 formed over a shallow trench isolation (STI) 104. While depicted as having three sacrificial gates for ease of illustration, it is understood that any number of sacrificial gates can be formed over the STI 104.

Figure 10:
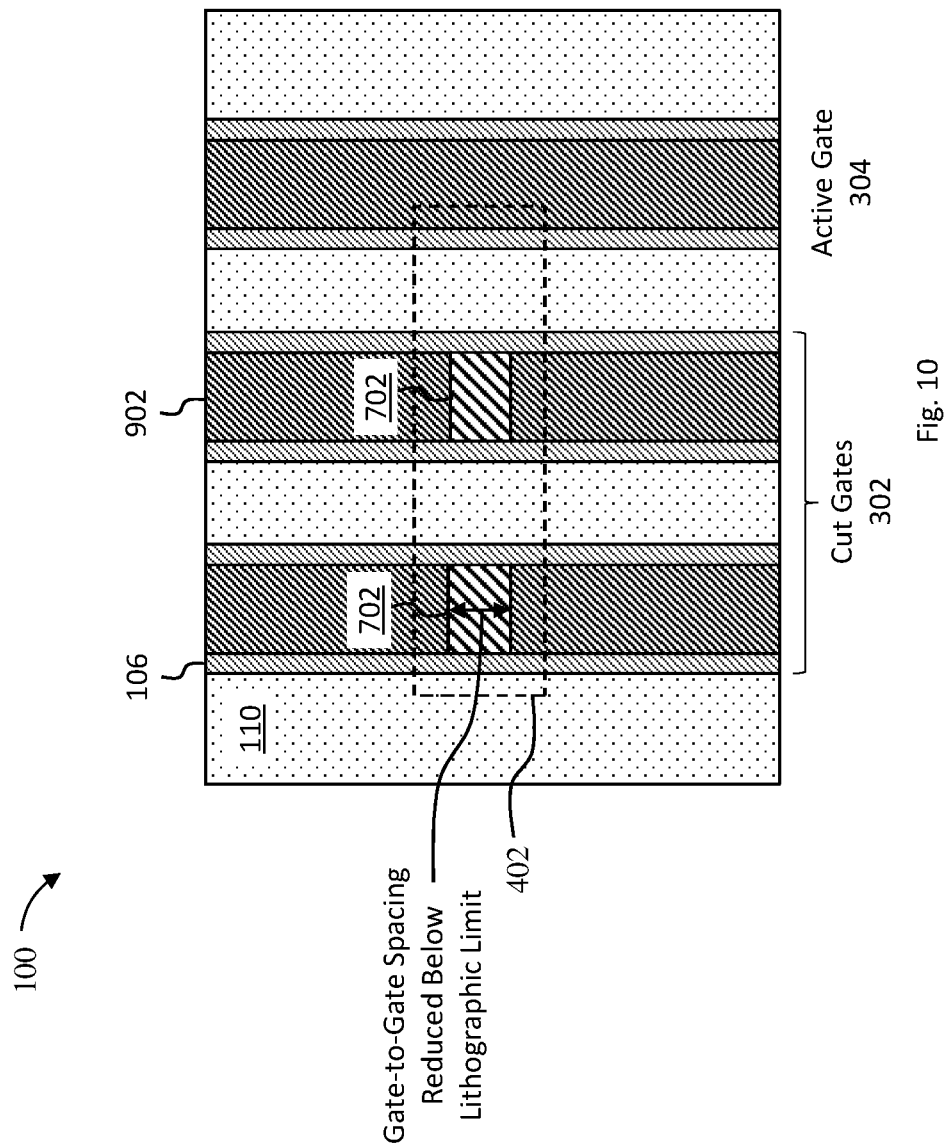
FIG. 10 depicts a top-down cross-sectional view of the semiconductor structure shown in FIG. 8 taken along the line A-A' after a processing operation according to one or more embodiments of the invention.

The sacrificial gates 102 can be made of any suitable material, such as, for example, amorphous silicon or polysilicon. The sacrificial gates 102 can be formed using any known method for patterning a sacrificial gate, such as, for example, a polysilicon fill and a sidewall image transfer with an anisotropic RIE. In some embodiments, the sacrificial gates 102 are replaced by conductive gates (as depicted in FIG. 10) during a subsequent replacement metal gate (RMG) process. In some embodiments, the sacrificial gates 102 extend over the STI 104 to active regions of a substrate (not depicted). The active regions of the substrate can include, for example, one or more semiconductor fins (not depicted).

In some embodiments, the STI 104 is formed over a substrate to electrically isolate the one or more semiconductor fins (not depicted). The STI 104 can be any suitable dielectric material, such as, for example, a silicon oxide, and can be formed using any suitable process. The STI 104 can be formed using, for example, a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, spin-on dielectrics, or other like processes. In some embodiments of the present invention, the STI 104 is overfilled and then recessed using, for example, chemical oxide removal (COR), to provide an active fin height of about 35 nm (i.e., a fin height above a surface of the STI 104), although other active fin heights are within the contemplated scope of the invention.

The substrate (not depicted) can be made of any suitable substrate material, such as, for example, monocrystalline Si, SiGe, SiC, III-V compound semiconductor, II-VI compound semiconductor, or semiconductor-on-insulator (SOI). In some embodiments of the present invention, the substrate includes a buried oxide layer. The buried oxide layer can be made of any suitable dielectric material, such as, for example, a silicon oxide. In some embodiments of the present invention, the buried oxide layer is formed to a thickness of about 145 nm, although other thicknesses are within the contemplated scope of the invention.

In some embodiments, spacers 106 (also known as sidewall spacers or gate spacers) are formed on sidewalls of the sacrificial gates 102. In some embodiments, the spacers 106 are formed using a CVD, PECVD, UHVCVD, RTCVD, MOCVD, LPCVD, LRPCVD, ALD, PVD, chemical solution deposition, or other like processes in combination with a wet or dry etch process. For example, spacer material can be conformally deposited over the semiconductor structure 100 and selectively removed using a RIE to form the spacers 106. The spacers 106 can be made of any suitable material, such as, for example, a low-k dielectric, a nitride, silicon nitride, silicon oxide, SiON, SiC, SiOCN, or SiBCN. In some embodiments, the spacers 106 include silicon nitride. The spacers 106 can be formed to a thickness of about 5 to 10 nm, although other thicknesses are within the contemplated scope of the invention.

In some embodiments, a dielectric liner 108 can be formed over sidewalls of the spacers 106 and on a surface of the STI 104. In some embodiments, the dielectric liner 108 is formed using a CVD, PECVD, UHVCVD, RTCVD, MOCVD, LPCVD, LRPCVD, ALD, PVD, chemical solution deposition, or other like processes in combination with a wet or dry etch process. For example, dielectric material can be conformally deposited over the semiconductor structure 100 and selectively removed using a RIE to form the dielectric liner 108. The dielectric liner 108 can be made of any suitable material, such as, for example, a low-k dielectric, a nitride, silicon nitride, silicon oxide, SiON, SiC, SiOCN, or SiBCN. The dielectric liner 108 can be formed to a thickness of about 0.2 to 10 nm, for example 2 nm, although other thicknesses are within the contemplated scope of the invention.

In some embodiments, an interlayer dielectric 110 is formed over a surface of the STI 104. In some embodiments, the interlayer dielectric 110 is formed such that the dielectric liner 108 is between the interlayer dielectric 110 and the STI 104. The interlayer dielectric 110 can be made of any suitable dielectric material, such as, for example, porous silicates, carbon doped oxides, silicon dioxides, silicon nitrides, silicon oxynitrides, or other dielectric materials. In some embodiments, the interlayer dielectric 110 includes a silicon oxide, such as $SiO_2$. Any known manner of forming the interlayer dielectric 110 can be utilized, such as, for example, CVD, PECVD, ALD, flowable CVD, spin-on dielectrics, or PVD. In some embodiments, the interlayer dielectric 110 is planarized to a top surface of the spacers 106, a top surface of the dielectric liner 108, and/or a top surface of a hard mask 112 using, for example, a chemical-mechanical planarization (CMP) process.

In some embodiments, the hard mask 112 (sometimes referred to as a dielectric cap) is formed after depositing a bulk sacrificial material. The bulk sacrificial material can then be patterned using the hard mask 112 to define the sacrificial gates 102. For example, the hard mask 112 can be patterned and the portions of the sacrificial material not covered by the hard mask 112 can be removed using, for example, a wet etch, a dry etch, or a combination of sequential wet and/or dry etches. The hard mask 112 can be made of any suitable material, such as, for example, a low-k dielectric, a nitride, silicon nitride, silicon oxide, SiON, SiC, SiOCN, or SiBCN. In some embodiments, the hard mask 112 includes silicon nitride. The hard mask 112 can be formed using CVD, PECVD, ALD, PVD, chemical solution deposition, or other like processes. The hard mask 112 can be formed to a thickness of about 5 to 100 nm, for example, 25 nm, although other thicknesses are within the contemplated scope of the invention.

Figure 2:
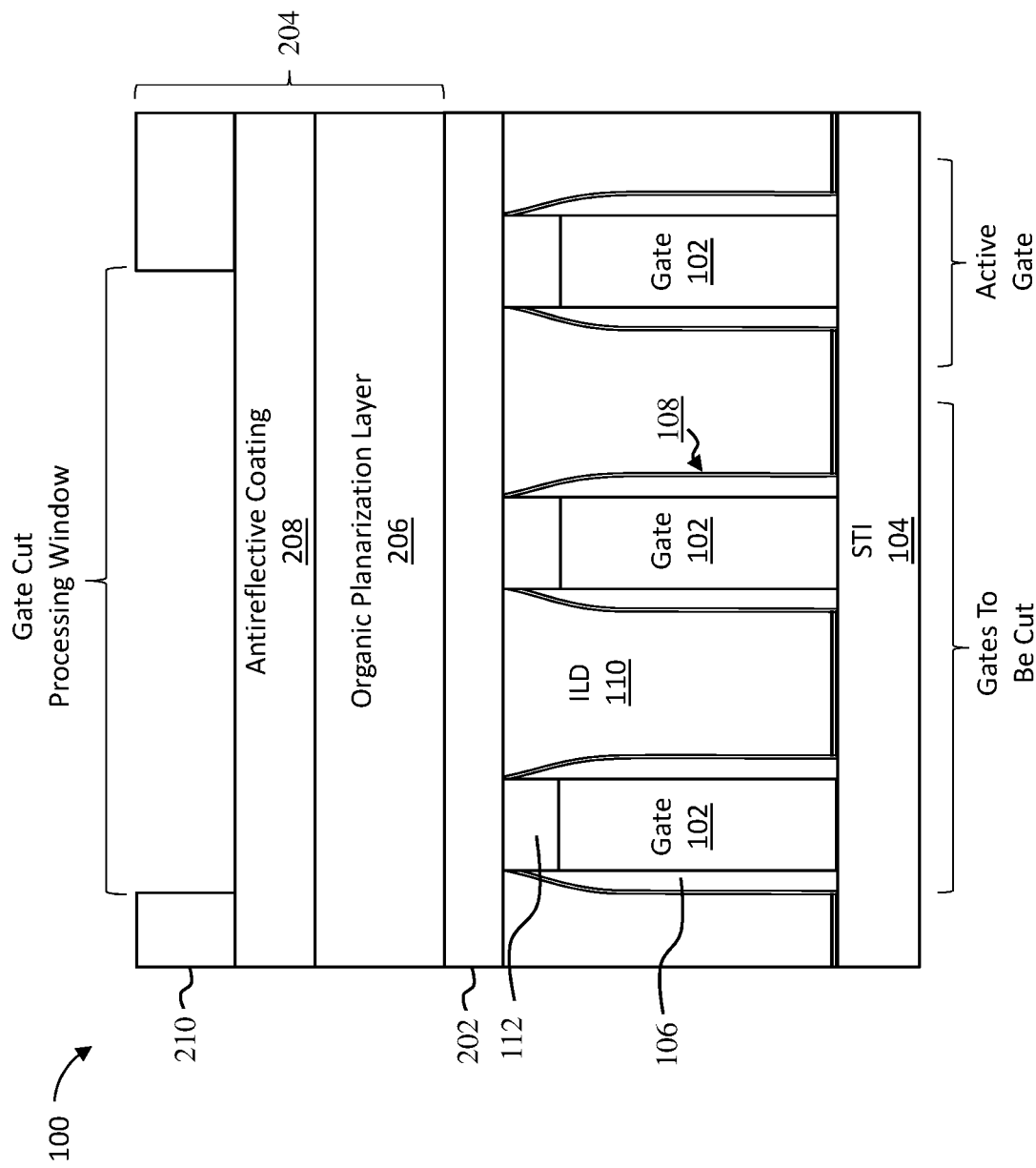
FIG. 2 depicts a cross-sectional view of a semiconductor structure after a processing operation according to one or more embodiments of the invention.

FIG. 2 depicts a cross-sectional view of the semiconductor structure 100 during an intermediate operation of a method of fabricating a semiconductor device according to one or more embodiments of the invention. As illustrated in FIG. 2, a block mask 202 (sometimes referred to as a gate cut patterning liner) can be formed over a surface of the ILD 110 and a surface of the hard mask 112. The block mask 202 can be made of any suitable material, such as, for example, a low-k dielectric, a nitride, silicon nitride, silicon oxide, SiON, SiC, SiOCN, or SiBCN. In some embodiments, the block mask 202 includes silicon nitride. The block mask 202 can be formed using CVD, PECVD, ALD, PVD, chemical solution deposition, or other like processes. The block mask 202 can be formed to a thickness of about 5 to 100 nm, for example, 10 nm, although other thicknesses are within the contemplated scope of the invention.

In some embodiments, a film stack 204 (sometimes referred to as a patterning layer stack) can be formed over the block mask 202. In some embodiments, the film stack 204 can be a bi-layer stack, a tri-layer stack, or a multilayer stack having a topmost photoresist layer. As depicted in FIG. 2, the film stack 204 can be a tri-layer stack having an organic planarization layer (OPL) 206, an antireflective coating 208, and a photoresist 210. Patterning layer stacks typically include OPLs because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

The OPL 206 can be formed over a surface of the block mask 202. In some embodiments, the OPL 206 can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL 206 can include any organic polymer and a photo-active compound having a molecular structure that can attach to the molecular structure of the organic polymer. In some embodiments, the OPL 206 material is selected to be compatible with the overlying antireflective coating 208, the overlying photoresist 210, and the lithographic wavelength employed (i.e., ArF, KrF, etc.). In some embodiments, the OPL 206 can be applied using, for example, spin coating technology.

The antireflective coating 208 can be made of any suitable antireflective material, such as, for example, a low temperature oxide (LTO), SiARC, TiARC, or SiON. The antireflective coating 208 can be deposited using, for example, a spin-on process. In some embodiments, the antireflective coating 208 is deposited to a thickness of about 0.5 to about 5 nm, although other thicknesses are within the contemplated scope of the invention.

The photoresist 210 can include any suitable photoresist material, such as, for example, 248 nm resists, 193 nm resists, 157 nm resists, or EUV (extreme ultraviolet) resists. In some embodiments, the photoresist 210 can be made of a light sensitive polymer, and can be deposited using any suitable resist process, such as spin-on coating. As depicted in FIG. 2, the photoresist 210 can be patterned (opened) to expose a surface of the antireflective coating 208. The photoresist 210 can be opened using any suitable process, for example, by exposure to a photo-lithography system developing solvent. The opening in the photoresist 210 defines a gate cut processing window. As described previously herein, the processing window defines which gates sections will be cut, and which gates will remain active (i.e., uncut). As depicted in FIG. 2, however, the processing window inadvertently overlaps a portion of an active gate (i.e., a gate that should not be cut).

Figure 3:
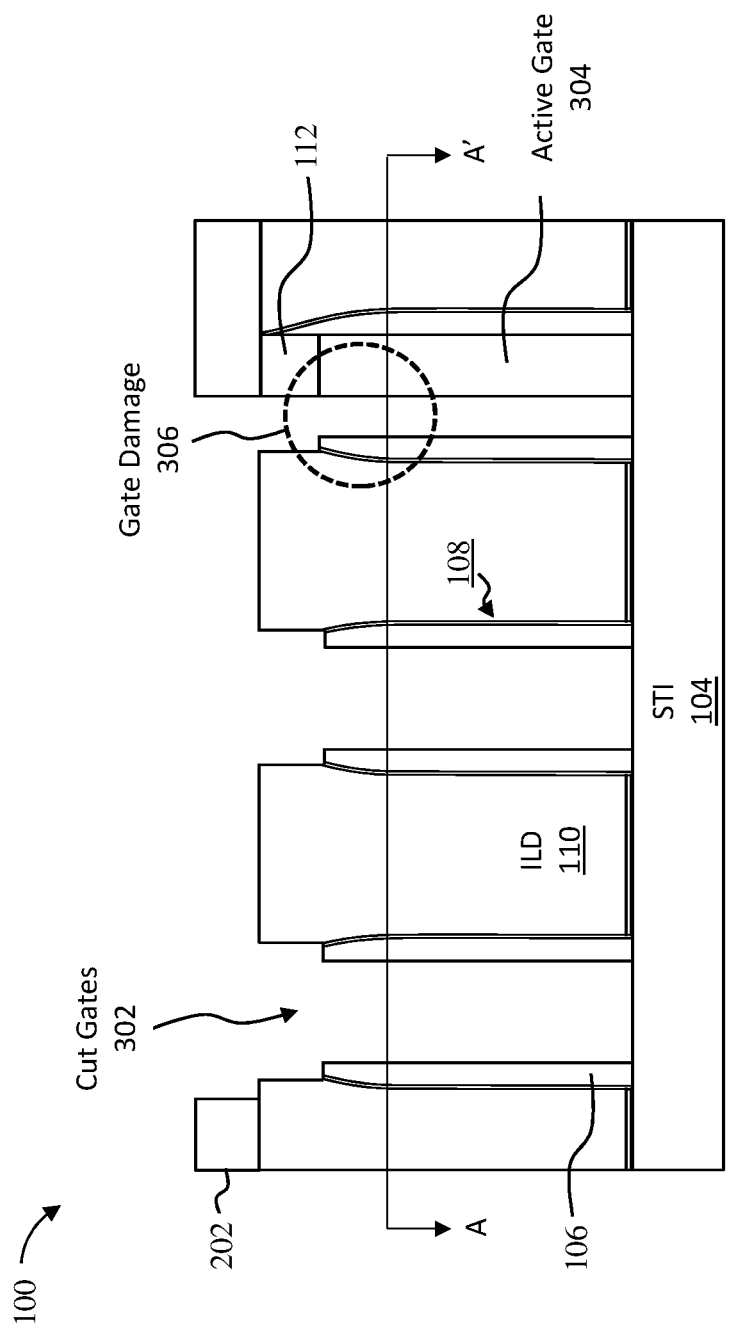
FIG. 3 depicts a cross-sectional view of a semiconductor structure after a processing operation according to one or more embodiments of the invention.

FIG. 3 depicts a cross-sectional view of the semiconductor structure 100 during an intermediate operation of a method of fabricating a semiconductor device according to one or more embodiments of the invention. As illustrated in FIG. 3, the block mask 202 can be patterned and the film stack 204 can be removed. In some embodiments, the film stack 204 is patterned and the pattern is transferred to the underlying block mask 202 using known photolithographic processes. For example, the pattern in the photoresist 210 can be transferred to the underlying antireflective coating 208 using a dry etch process. The photoresist 210 can be removed using, for example, an ashing process. The pattern in the antireflective coating 208 can be transferred to the underlying OPL 206 and to the block mask 202 using, for example, a wet etch, a dry etch, or a combination of wet and/or dry etches. The OPL 206 can be removed using, for example, a dry removal process, such as a RIE or plasma ash.

In some embodiments, the block mask 202 is patterned to expose a surface of one or more gates to be cut. In some embodiments, the block mask 202 is patterned to expose one or more surfaces of the hard mask 112. In some embodiments, portions of the hard mask 112 and portions of the dielectric liner 108 within the processing window are removed, exposing a top surface of one or more gates to be cut. Exposed portions of the gates to be cut can then be removed using, for example, a ME, resulting in one or more cut gates 302. In some embodiments, the ME is selective to the spacers 106 and/or the dielectric liner 108.

In some embodiments, the block mask 202 pattern inadvertently exposes a portion of an active gate 304, due to a misalignment of the processing window (as depicted in FIG. 2). In some embodiments, the exposed portion of the active gate 304 is removed during the gate cut etching process, resulting in gate damage 306. As depicted in FIG. 3, the active gate 304 has been partially etched, exposing a surface of the STI 104. As discussed previously herein, the final semiconductor device can not function at all, or can function improperly, depending on the severity of the active gate damage 306 (i.e., the degree of misalignment of the gate cut processing window), unless the damage is corrected.

Figure 4:
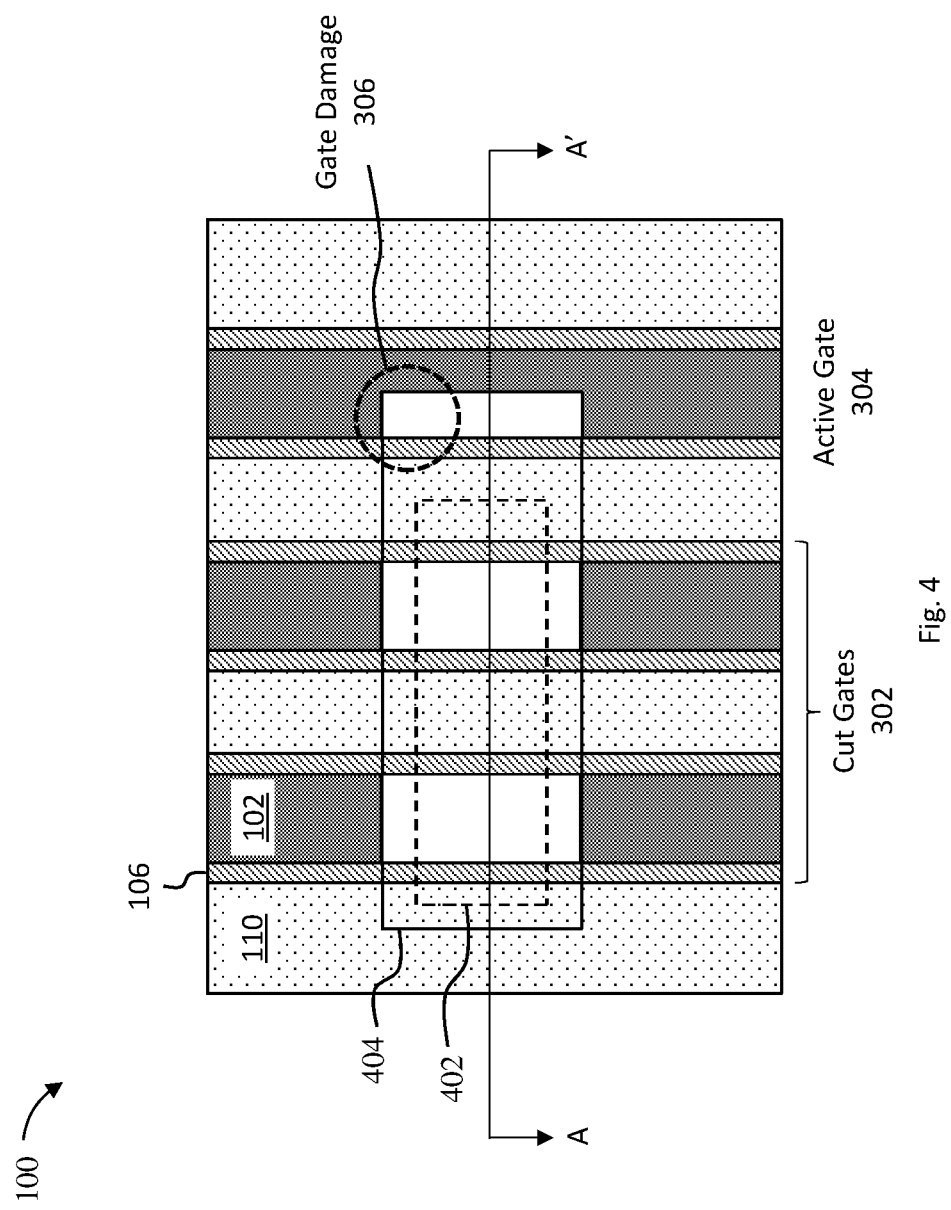
FIG. 4 depicts a top-down cross-sectional view of the semiconductor structure shown in FIG. 3 taken along the line A-A' after a processing operation according to one or more embodiments of the invention.

FIG. 4 depicts a top-down cross-sectional view of the semiconductor structure 100 shown in FIG. 3 taken along the line A-A'. As depicted in FIG. 4, a target gate cut processing window 402 overlaps a portion of the cut gates 302, but does not overlap a portion of the active gate 302. In this ideal scenario, portions of the cut gates 302 within the target gate cut processing window 402 are completely removed without removing any portion of the active gate 304.

Unfortunately, perfect alignment of a gate cut processing window is difficult, especially as device critical dimensions, and respective processing window tolerances, decrease. In some embodiments, an actual gate cut processing window 404 is misaligned with respect to the target gate cut processing window 402. For example, the actual gate cut processing window 404 can be larger than, smaller than, or shifted in position with respect to the target gate cut processing window 402.

As depicted in FIG. 4, the actual gate cut processing window 404 is both larger than and positionally shifted from the target gate cut processing window 402, although other misalignments are within the contemplated scope of the invention. This misalignment can result in all or a portion of a neighboring active gate (e.g., the active gate 304) being inadvertently exposed to the gate cut process. As depicted in FIG. 4, the misalignment of the actual gate cut processing window 404 has resulted in a partial etch of the active gate 304 (i.e., the gate damage 306).

Figure 5:
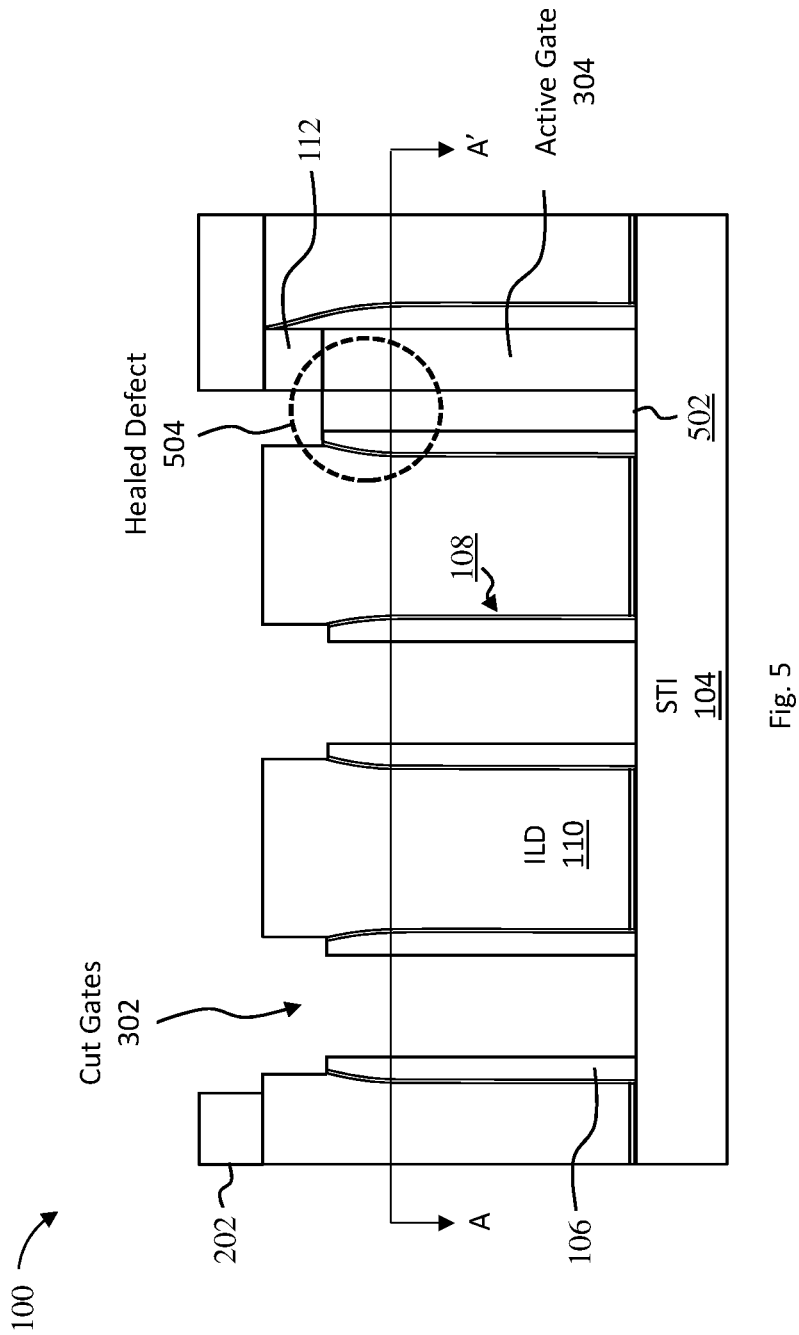
FIG. 5 depicts a cross-sectional view of a semiconductor structure after a processing operation according to one or more embodiments of the invention.

FIG. 5 depicts a cross-sectional view of the semiconductor structure 100 during an intermediate operation of a method of fabricating a semiconductor device according to one or more embodiments of the invention. As illustrated in FIG. 5, a selective silicon on silicon deposition process is leveraged to regrow portions of the active gate 304. During this process, silicon grows on exposed silicon surfaces, but does not grow on exposed dielectric regions, such as portions of the shallow trench isolation (STI) or gate spacers. Known selective deposition techniques can differentiate between silicon and oxides or other dielectrics ($SiO_2$, SiON, SIBCN, etc.). For example, known surface deactivation techniques can be used to selectively protect dielectric surfaces, while leaving the silicon surface exposed. Precursor materials can then be preferentially grown on the exposed silicon surface, while precursor growth on the dielectric surface is hindered.

As depicted in FIG. 5, the selective silicon on silicon deposition process results in a silicon regrowth 502 building up on an exposed sidewall of the active gate 304. The amount of silicon regrowth can be controlled using, for example, an atomic layer deposition cycle time. In some embodiments, the selective silicon on silicon deposition process continues until the gate damage 306 (depicted in FIG. 3) has completed refilled with silicon material, resulting in a healed defect 504.

Figure 6:
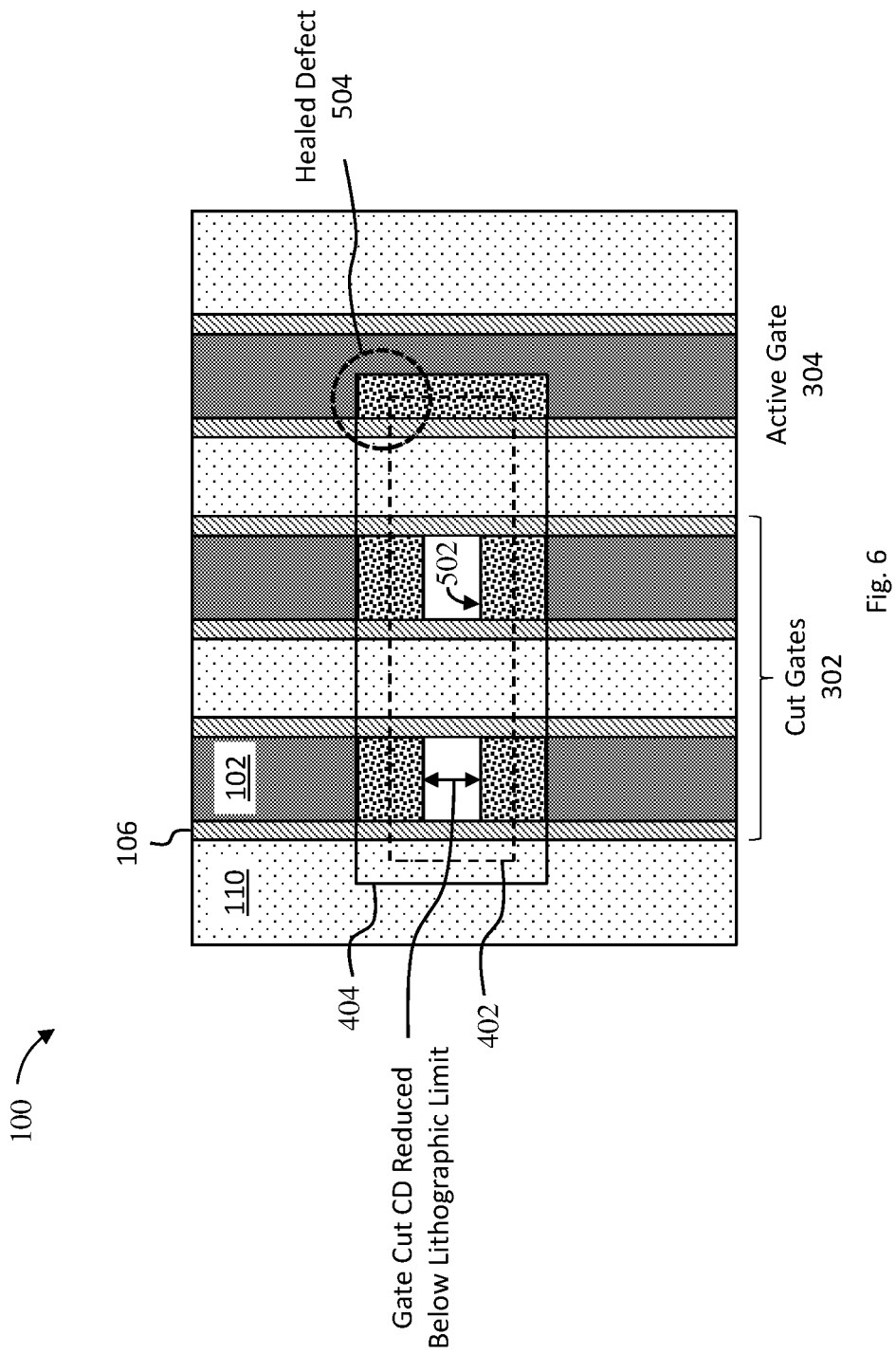
FIG. 6 depicts a top-down cross-sectional view of the semiconductor structure shown in FIG. 5 taken along the line A-A' after a processing operation according to one or more embodiments of the invention.

FIG. 6 depicts a top-down cross-sectional view of the semiconductor structure 100 shown in FIG. 5 taken along the line A-A'. As depicted in FIG. 6, the silicon on silicon deposition process replaces the inadvertently removed portions of the active gate 304 within the actual gate cut processing window 404 with new silicon material. As further depicted in FIG. 6, the silicon on silicon deposition process results in a silicon regrowth 502 building up on all exposed silicon surfaces. In other words, selective silicon on silicon deposition is not limited to the exposed sidewall of the active gate 304. Instead, selective silicon on silicon regrowth also occurs on all exposed silicon surfaces, such as the exposed sidewalls of the cut gates 302. In some embodiments, selective silicon on silicon deposition continues on the sidewalls of the cut gates 302 until the gate cut CD is below the lithographic limit (e.g., a CD smaller than that available using the target gate cut processing window 402). In this manner, the final gate cut CD can be scaled to below the dimensions that optical or EUV lithography can print.

Figure 7:
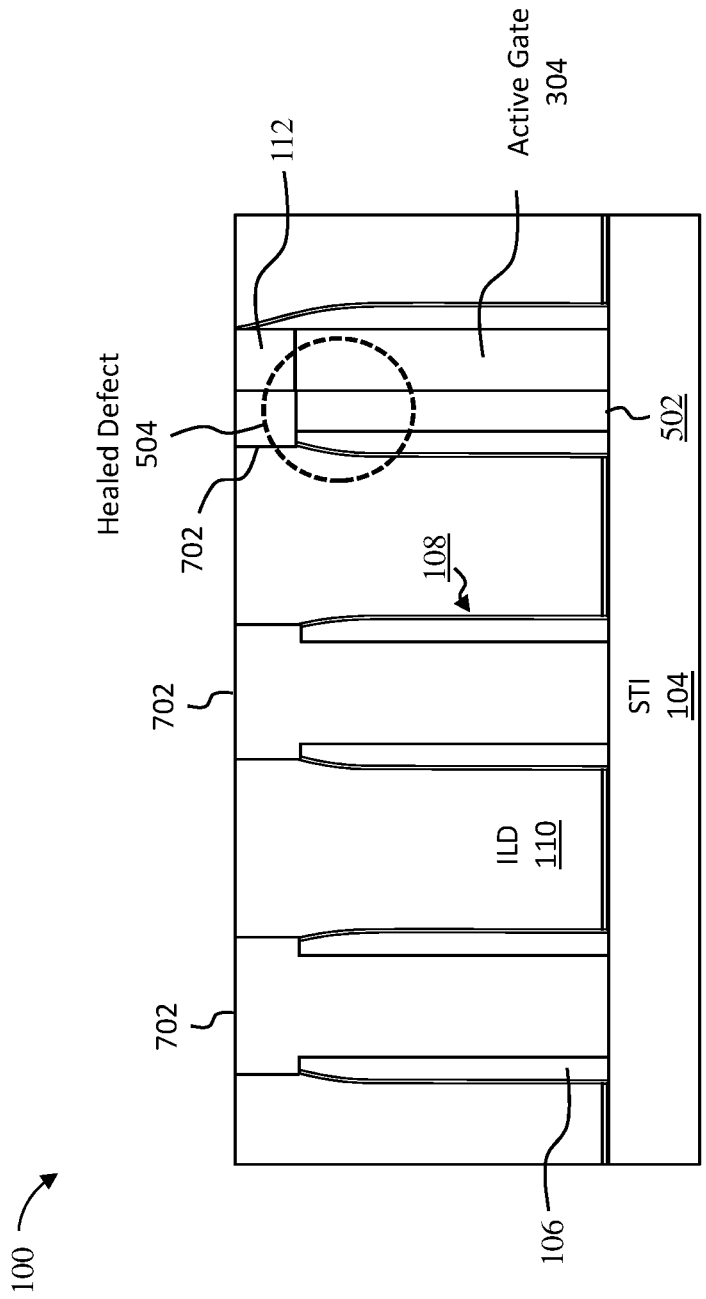
FIG. 7 depicts a cross-sectional view of a semiconductor structure after a processing operation according to one or more embodiments of the invention.

FIG. 7 depicts a cross-sectional view of the semiconductor structure 100 during an intermediate operation of a method of fabricating a semiconductor device according to one or more embodiments of the invention. As illustrated in FIG. 7, a gate cut dielectric 702 can be formed over exposed surfaces of the STI 104 and over exposed surfaces of the silicon regrowth 502 within the actual gate cut processing window 404. In this manner, trenches formed during the gate cut process can be filled with dielectric material.

The gate cut dielectric 702 can be made of any suitable material, such as, for example, a low-k dielectric, a nitride, silicon nitride, silicon oxide, SiON, SiC, SiOCN, or SiBCN. In some embodiments, the gate cut dielectric 702 is made of silicon nitride. In some embodiments, the gate cut dielectric 702 is formed using a CVD, PECVD, UHVCVD, RTCVD, MOCVD, LPCVD, LRPCVD, ALD, PVD, chemical solution deposition, or other like processes. In some embodiments, the gate cut dielectric 702 is deposited and then planarized using, for example, CMP. In some embodiments, the gate cut dielectric 702 is planarized to a surface of the hard mask 112.

Figure 8:
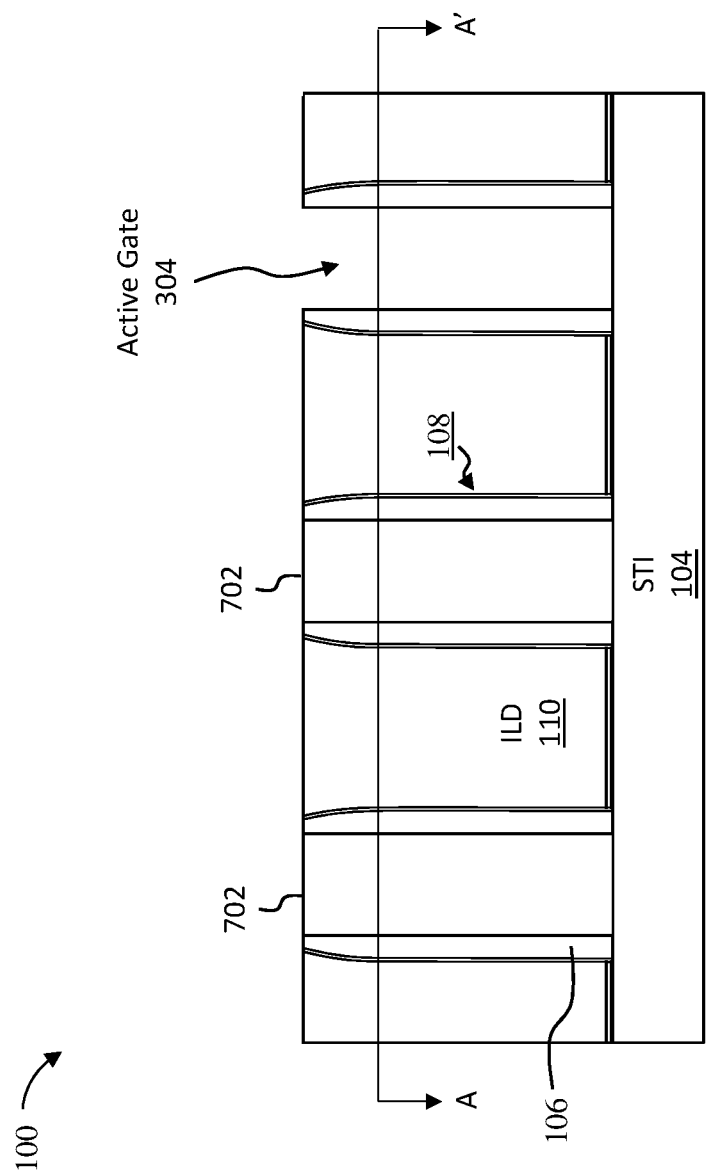
FIG. 8 depicts a cross-sectional view of a semiconductor structure after a processing operation according to one or more embodiments of the invention.

FIG. 8 depicts a cross-sectional view of the semiconductor structure 100 during an intermediate operation of a method of fabricating a semiconductor device according to one or more embodiments of the invention. As illustrated in FIG. 8, the remaining portions of the sacrificial gates 102 and the silicon regrowth 502 (including, e.g., the active gate 304) are removed to expose a surface of the STI 104. The sacrificial gates 102 and the silicon regrowth 502 can be removed using known RMG processes, such as an amorphous silicon or polysilicon pull.

In some embodiments, a surface of the sacrificial gates 102 and the silicon regrowth 502 is exposed after removing a portion of the gate cut dielectric 702. The gate cut dielectric 702 can be removed using, for example, a CMP selective to the spacers 106. In some embodiments, the exposed sacrificial gates 102 and silicon regrowth 502 are removed using a wet etch, a dry etch, or a combination of sequential wet and/or dry etches. In some embodiments, the exposed sacrificial gates 102 and silicon regrowth 502 are removed using a RIE selective to the spacers 106, the gate cut dielectric 702, and/or the dielectric liner 108.

Figure 9:
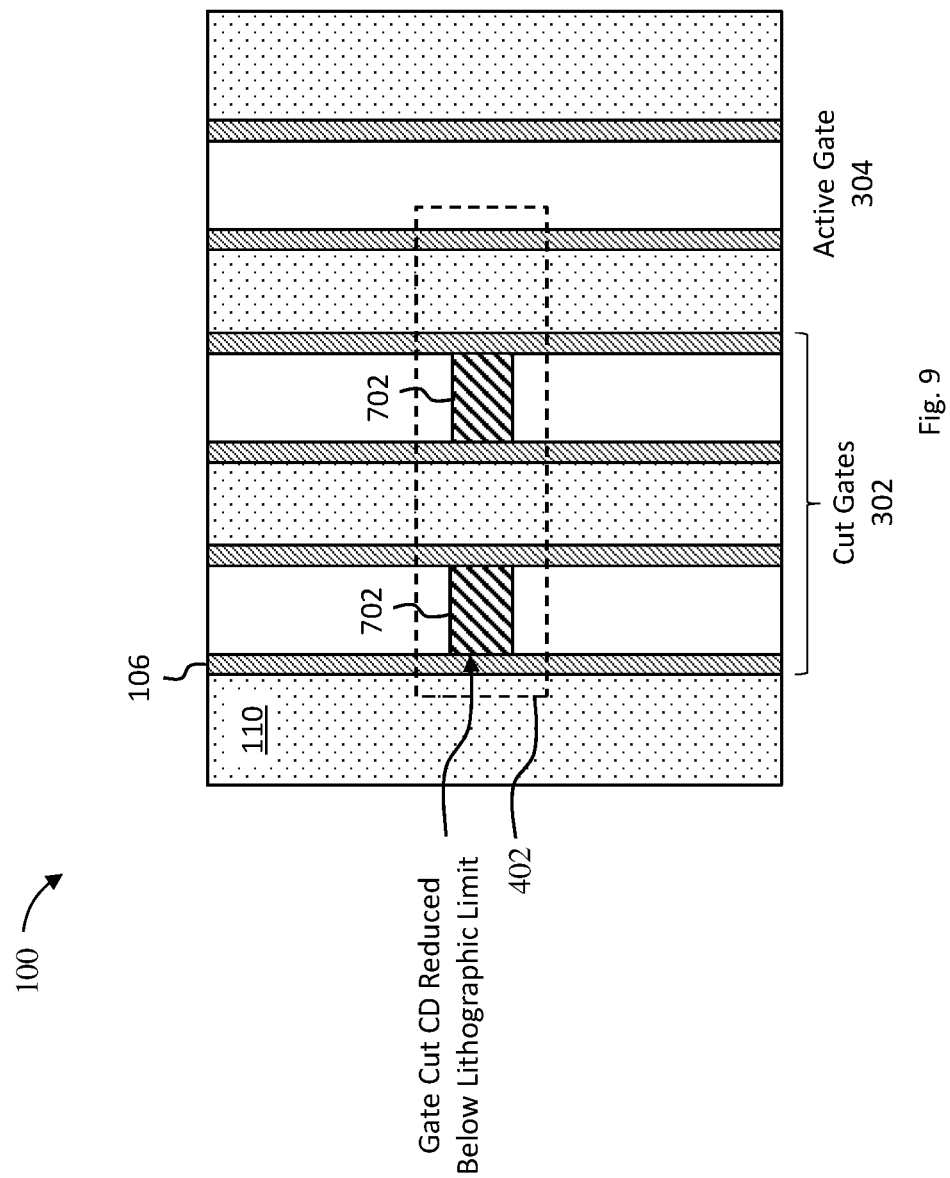
FIG. 9 depicts a top-down cross-sectional view of the semiconductor structure shown in FIG. 8 taken along the line A-A' after a processing operation according to one or more embodiments of the invention.

FIG. 9 depicts a top-down cross-sectional view of the semiconductor structure 100 shown in FIG. 8 taken along the line A-A' after removing the sacrificial gates 102. As depicted in FIG. 9, the gate cut dielectric 702 CD is below the lithographic limit. Advantageously, the gate cut dielectric 702 was not formed or deposited within the active gate 304, due to the silicon regrowth 502 blocking off the portion of the active gate 304 within the actual gate cut processing window 404 (as depicted in FIG. 6).

FIG. 10 depicts a top-down cross-sectional view of the semiconductor structure 100 shown in FIG. 8 taken along the line A-A' after forming one or more conductive gates 902. The conductive gates 902 can be formed using, for example, known RMG processes. In some embodiments, the conductive gates 902 are formed by depositing conductive material over the exposed surface of the STI 104, between the spacers 106, and adjacent to sidewalls of the gate cut dielectric 702. In some embodiments, the conductive material is planarized to a surface of the gate cut dielectric 702 and/or the spacers 106. As depicted in FIG. 10, the gate cut dielectric 702 CD defines the final gate-to-gate spacing between adjacent ends of the cut gates 302 (i.e., the final CD after the lithographically defined CD is effectively reduced).

The conductive gates 902 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

In some embodiments, the conductive gates 902 are high-k metal gates (HKMG) and a high-k dielectric film (not depicted) is formed between each conductive gate and the substrate. In some embodiments, the high-k dielectric film can be used to modify the work function of the conductive gates 902. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric film can have a thickness of about 0.5 nm to about 4 nm. In some embodiments, the high-k dielectric film has a thickness of about 2 nm, although other thicknesses are within the contemplated scope of the invention.

In some embodiments, work function layers (not depicted) are formed between the high-k dielectric film and the conductive gates 902. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to further modify the work function of the conductive gates 902. The work function layers can be formed to a thickness of about 2 to 10 nm, although other thicknesses are within the contemplated scope of the invention.

Figure 11:
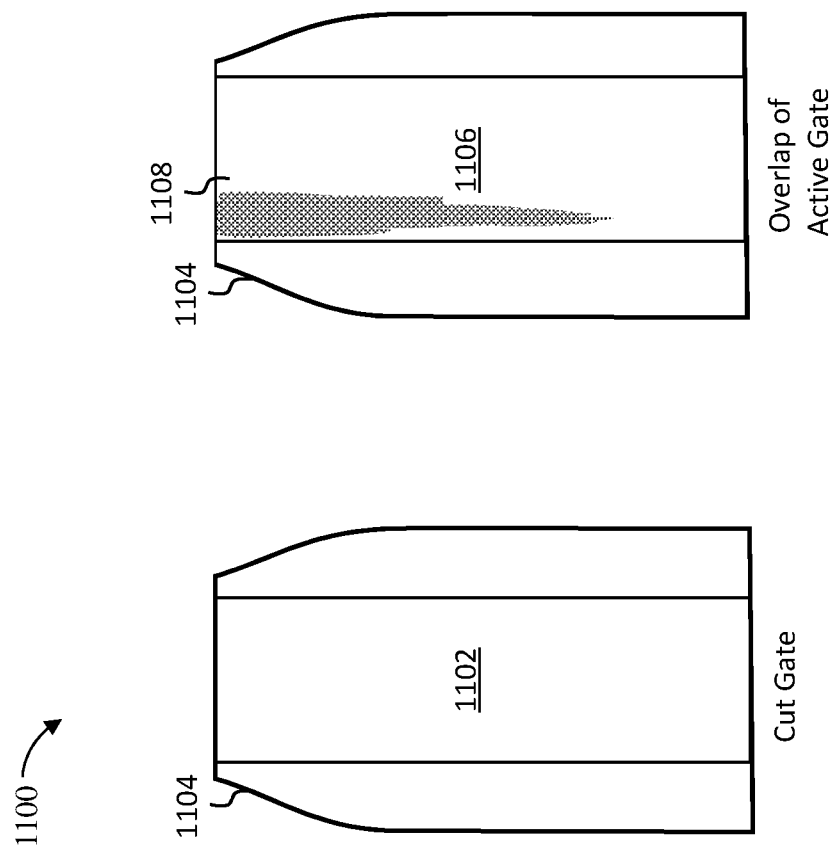
FIGS. 11A and 11B depict cross-sectional views of a semiconductor structure during an intermediate operation of a method of fabricating a semiconductor device according to one or more embodiments of the invention.

FIGS. 11A and 11B depict cross-sectional views of a semiconductor structure 1100 during an intermediate operation of a method of fabricating a semiconductor device according to one or more embodiments of the invention. FIG. 11A illustrates an exemplary cross-sectional view of a cut gate following the formation and planarization of a gate cut mask 1102 according to one or more embodiments. As discussed previously herein, the gate cut mask 1102 can be formed between sidewalls of gate spacers 1104, in a similar manner as the gate cut dielectric 702 depicted in FIG. 7.

FIG. 11B illustrates an exemplary cross-sectional view of an active gate 1106 damaged from an overlap of a processing window following the formation and planarization of the gate cut mask 1102. A silicon regrowth 1108 is formed on a surface of the active gate 1106 during a selective silicon on silicon deposition, according to one or more embodiments. For example, the silicon regrowth 1108 can be formed in a similar manner as the silicon regrowth 502 depicted in FIG. 7.

Figure 12:
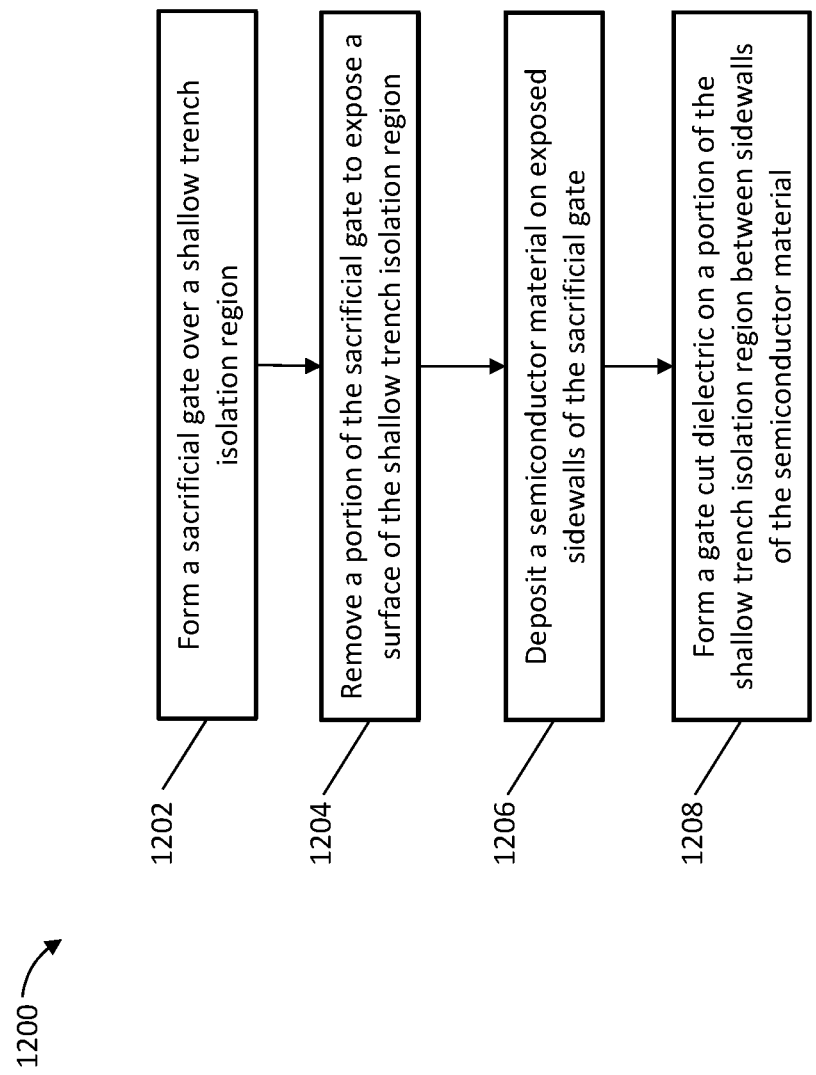
FIG. 12 depicts a flow diagram illustrating a method according to one or more embodiments of the invention.

FIG. 12 depicts a flow diagram 1200 illustrating a method for forming a semiconductor device according to one or more embodiments of the invention. As shown at block 1202, a sacrificial gate is formed over a shallow trench isolation region. At 1204, a portion of the sacrificial gate is removed to expose a surface of the shallow trench isolation region.

As shown at block 1206, a semiconductor material (e.g., silicon material) is deposited on exposed sidewalls of the sacrificial gate. The semiconductor material can be deposited using, for example, a selective silicon on silicon deposition, according to one or more embodiments. For example, the semiconductor material can be deposited in a similar manner as the silicon regrowth 502 depicted in FIG. 5.

At block 1208, a gate cut dielectric is formed on a portion of the shallow trench isolation region between sidewalls of the semiconductor material. The gate cut dielectric can be formed in a similar manner as the gate cut dielectric 702 depicted in FIG. 7. Advantageously, a CD (i.e., thickness) of the gate cut dielectric can be less than the available optical or EUV lithographic limit, for example, less than about 15 nm, due to the selective silicon on silicon deposition pinching off an area between adjacent sacrificial gates.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a sacrificial gate over a shallow trench isolation region;
    forming a gate cut processing window that partially overlies the sacrificial gate, wherein the gate cut processing window covers a first portion of the sacrificial gate but does not cover a second portion of the sacrificial gate;
    removing the first portion of the sacrificial gate to expose a surface of the shallow trench isolation region;
    depositing a semiconductor material on exposed sidewalls of the second portion of the sacrificial gate; and
    forming a gate cut dielectric on a topmost surface of the semiconductor material.

2. The method of claim 1, wherein the sacrificial gate comprises amorphous silicon or polysilicon.

3. The method of claim 2, wherein depositing the semiconductor material comprises a selective silicon on silicon deposition.

4. The method of claim 1 further comprising removing a remaining portion of the sacrificial gate to expose portions of the shallow trench isolation regions that are not covered by the gate cut dielectric.

5. The method of claim 1 further comprising:
    forming a first conductive gate over a first portion of the shallow trench isolation region that is not covered by the gate cut dielectric; and
    forming a second conductive gate over a second portion of the shallow trench isolation region that is not covered by the gate cut dielectric.

6. The method of claim 5, wherein a thickness of the gate cut dielectric defines a gate-to-gate spacing between the first conductive gate and the second conductive gate.

7. The method of claim 6, wherein the thickness of the gate cut dielectric is less than about 15 nm.

8. The method of claim 1, wherein the gate cut dielectric comprises SiN, SiON, SiC, SiOCN, or SiBCN.

9. The method of claim 1, wherein forming the sacrificial gate further comprises:
    depositing a bulk sacrificial material over the shallow trench isolation; and
    patterning the bulk sacrificial material to define the sacrificial gate.

10. The method of claim 9 further comprising forming a spacer on a sidewall of the sacrificial gate.

11. A method for forming a semiconductor device, the method comprising:
    forming a first sacrificial gate in a gate cut region of a shallow trench isolation region;
    forming a second sacrificial gate in an active gate region of the shallow trench isolation region;
    forming a gate cut processing window that covers the first sacrificial gate and partially covers the second sacrificial gate, wherein the gate cut processing window covers a first portion of the second sacrificial gate but does not cover a second portion of the second sacrificial gate;
    removing a portion of the first sacrificial gate and the first portion of the second sacrificial gate to expose a surface of the shallow trench isolation region;
    depositing a semiconductor material on an exposed sidewall of the first sacrificial gate and on an exposed sidewall of the second portion of the second sacrificial gate, the semiconductor material on the exposed sidewall of the second portion of the second sacrificial gate completely covering the shallow trench isolation region; and
    forming a gate cut dielectric on a portion of the shallow trench isolation region between sidewalls of the semiconductor material on the first sacrificial gate and a topmost surface of the semiconductor material on the exposed sidewall of the second portion of the second sacrificial gate.

12. The method of claim 11, wherein the first sacrificial gate and the second sacrificial gate comprise amorphous silicon or polysilicon.

13. The method of claim 12, wherein depositing the semiconductor material comprises a selective silicon on silicon deposition.

14. The method of claim 11 further comprising removing the first sacrificial gate and the second sacrificial gate to expose portions of the shallow trench isolation region that are not covered by the gate cut dielectric.

15. The method of claim 11, further comprising:
    forming a first conductive gate over a first portion of the shallow trench isolation region in the gate cut region that is not covered by the gate cut dielectric;
    forming a second conductive gate over a second portion of the shallow trench isolation region in the gate cut region that is not covered by the gate cut dielectric; and
    forming a third conductive gate over a third portion of the shallow trench isolation region in the active gate region.

16. The method of claim 15, wherein a thickness of the gate cut dielectric defines a gate-to-gate spacing between the first conductive gate and the second conductive gate.

17. The method of claim 16, wherein the thickness of the gate cut dielectric is less than about 15 nm.

18. The method of claim 11, wherein the gate cut dielectric comprises SiN, SiON, SiC, SiOCN, or SiBCN.

19. The method of claim 11, further comprising:
    depositing a bulk sacrificial material over the shallow trench isolation region;
    patterning the bulk sacrificial material to define the first sacrificial gate and the second sacrificial gate; and
    forming a spacer on a sidewall of the second sacrificial gate.

20. The method of claim 19, wherein the semiconductor material fills a space between the spacer and the sidewall of the second sacrificial gate.

* * * * *